(12) United States Patent
Chen et al.

(10) Patent No.: US 7,859,806 B2
(45) Date of Patent: *Dec. 28, 2010

(54) SYSTEM AND METHOD OF ELECTROSTATIC DISCHARGE PROTECTION FOR SIGNALS AT VARIOUS VOLTAGES

(75) Inventors: Zhiliang Chen, Shanghai (CN); Shifeng Zhao, Shanghai (CN); Lieyi Fang, Shanghai (CN); Zhen Zhu, Shanghai (CN); Jun Ye, Shanghai (CN)

(73) Assignee: On-Bright Electronics (Shanghai) Co., Ltd., Zhangjiang Hi Tech Park, Shanghai (CN)

( * ) Notice: Subject to any disclaimer, the term of this patent is extended or adjusted under 35 U.S.C. 154(b) by 10 days.

This patent is subject to a terminal disclaimer.

(21) Appl. No.: 12/103,608

(22) Filed: Apr. 15, 2008

(65) Prior Publication Data

US 2009/0213507 A1 Aug. 27, 2009

Related U.S. Application Data

(63) Continuation of application No. 11/165,820, filed on Jun. 23, 2005, now Pat. No. 7,382,592.

(30) Foreign Application Priority Data

Jun. 20, 2005 (CN) .......................... 2005 1 0027169

(51) Int. Cl.
   *H02H 9/00* (2006.01)
(52) U.S. Cl. .......................... 361/56; 361/91.1; 361/111
(58) Field of Classification Search .................. 361/56, 361/91.1, 111
   See application file for complete search history.

(56) References Cited

U.S. PATENT DOCUMENTS

| | | | | |
|---|---|---|---|---|
| 5,513,088 | A * | 4/1996 | Williamson | 363/21.18 |
| 5,946,177 | A * | 8/1999 | Miller et al. | 361/56 |
| 5,978,197 | A * | 11/1999 | Chan | 361/111 |
| 6,631,061 | B2 * | 10/2003 | Okawa | 361/56 |
| 6,992,467 | B1 * | 1/2006 | Fey | 323/266 |
| 7,382,592 | B2 * | 6/2008 | Chen et al. | 361/56 |
| 2001/0043449 | A1 * | 11/2001 | Okushima | 361/56 |
| 2002/0171298 | A1 * | 11/2002 | Chen et al. | 307/127 |
| 2003/0026054 | A1 * | 2/2003 | Hulfachor et al. | 361/111 |
| 2005/0212052 | A1 * | 9/2005 | Yach et al. | 257/360 |
| 2006/0152870 | A1 * | 7/2006 | Chen et al. | 361/56 |
| 2006/0209479 | A1 * | 9/2006 | Grombach et al. | 361/56 |

FOREIGN PATENT DOCUMENTS

EP 803955 A2 * 10/1997

* cited by examiner

*Primary Examiner*—Jared J Fureman
*Assistant Examiner*—Christopher J Clark
(74) *Attorney, Agent, or Firm*—Jones Day

(57) ABSTRACT

System and method for protecting an integrated circuit. The system includes a first transistor coupled to a first voltage and a second voltage, a second transistor coupled to the gate of the first transistor and the first voltage, a third transistor coupled to the gate of the second transistor and the first voltage, and a capacitor coupled to the gate of the second transistor and the second voltage. The first voltage is provided to the integrated circuit, the gate of the third transistor is configured to receive a first control signal, the gate of the second transistor is configured to receive a second control signal, and the second control signal is capable of turning off the second transistor a time period after the third transistor is turned off.

18 Claims, 5 Drawing Sheets

SYSTEM AND METHOD OF ELECTROSTATIC DISCHARGE PROTECTION FOR SIGNALS AT VARIOUS VOLTAGES

CROSS-REFERENCES TO RELATED APPLICATIONS

This application is a continuation of U.S. patent application Ser. No. 11/165,820, filed Jun. 23, 2005, which claims priority to Chinese Patent Application No. 200510027169.7, filed Jun. 20, 2005, entitled "System and Method of Electrostatic Discharge Protection for Signals at Various Voltages," by Inventors Zhiliang Chen, Shifeng Zhao, Lieyi Fang, Zhen Zhu, and Jun Ye, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits. More particularly, the invention provides a system and method for electrostatic discharge protection. Merely by way of example, the invention has been applied to signals at various voltages. But it would be recognized that the invention has a much broader range of applicability.

For signals at various voltages, excessive electrostatic discharges (ESD) can cause failure of an integrated circuit. Therefore a robust on-chip ESD protection circuit is often required to protect the internal semiconductor circuitry. For example, the ESD protection circuit includes a triggering mechanism. When a pin voltage falls outside certain operating conditions, the triggering element enables the ESD protection circuit to conduct most of the ESD current. On the other hand, under normal operation conditions, the triggering mechanism should often ensure the ESD protection circuit remains in an off state.

FIG. 1 is a simplified conventional system for ESD protection. A system 100 includes an NMOS transistor 110, a capacitor 120, and a resistor 130. The NMOS transistor 110 is a large transistor and coupled to both pads 140 and 150. The capacitor 120 is connected to the pad 140, and the resistor 130 is connected to the pad 150. As shown in FIG. 1, the pad 140 provides a signal to an internal circuit, which is protected by the system 100. The pad 150 is biased to a ground voltage level of $V_{ss}$. The capacitor 120 and the resistor 130 can provide a triggering mechanism. For example, the gate of the transistor 110 is grounded through the resistor 130 during normal operation. The NMOS transistor usually remains in an off state. During an ESD event, the voltage level at the pad 140 changes quickly with time. Therefore, the gate of the transistor 110 is AC-coupled through the capacitor 120 up to above the threshold voltage of the NMOS transistor 110. The NMOS transistor 110 is thus turned on to conduct the ESD current. The system 100 has certain weaknesses in high-voltage applications. For example, the NMOS transistor 110 can be turned on by high voltage transient signal at the pad 140 even during normal operation. The system 100 may thus interfere with the normal operation of the internal circuit.

Hence it is highly desirable to improve techniques for ESD protection.

BRIEF SUMMARY OF THE INVENTION

The present invention is directed to integrated circuits. More particularly, the invention provides a system and method for electrostatic discharge protection. Merely by way of example, the invention has been applied to signals at various voltages. But it would be recognized that the invention has a much broader range of applicability.

According to one embodiment of the present invention, a system for protecting an integrated circuit is provided. The system includes a first transistor coupled to a first voltage and a second voltage, a second transistor coupled to the gate of the first transistor and the first voltage, a third transistor coupled to the gate of the second transistor and the first voltage, and a capacitor coupled to the gate of the second transistor and the second voltage. The first voltage is provided to the integrated circuit, the gate of the third transistor is configured to receive a first control signal, the gate of the second transistor is configured to receive a second control signal, and the second control signal is capable of turning off the second transistor a time period after the third transistor is turned off.

According to another embodiment, a method for protecting an integrated circuit includes providing a system for protecting the integrated circuit. The system includes a first transistor coupled to a voltage, a second transistor, a third transistor, and a capacitor. Additionally, the method includes turning on the first transistor, receiving a first control signal by the third transistor, turning off the third transistor in response to the first control signal, and receiving a second control signal by the second transistor a time period after the third transistor being turned off. Moreover, the method includes turning off the second transistor in response to the second control signal, and turning off the first transistor in response to the second transistor being turned off. The voltage is provided to the integrated circuit, and the first transistor is in an on state within the time period.

According to yet another embodiment of the present invention, a system for protecting an integrated circuit includes a first transistor coupled to a first voltage and a second voltage, and a second transistor including an emitter, a base, and a collector. Additionally, the system includes a resistor coupled to the base, and a first diode including an anode and a cathode and coupled to the second voltage and the resistor. The first voltage is provided to the integrated circuit, the anode is connected to the second voltage, and the cathode is connected to the resistor.

According to yet another embodiment of the present invention, a system for protecting an integrated circuit includes a first transistor coupled to a first voltage and a second voltage, and a second transistor including an emitter, a base, and a collector. Additionally, the system includes a first diode including an anode and a cathode and coupled to the base and the resistor, and a resistor coupled to the second voltage. The first voltage is provided to the integrated circuit, the cathode is connected to the base, and the anode is connected to the resistor.

According to yet another embodiment of the present invention, a method for protecting an integrated circuit includes providing a system for protecting the integrated circuit. The system includes a first transistor, a second transistor, a diode, and a resistor. Additionally, the method includes receiving a voltage by the first transistor and the second transistor, causing a breakdown of the diode, turning on the second transistor in response to the breakdown of the diode, and turning on the first transistor in response to the second transistor being turned on. The voltage is provided to the integrated circuit. For example, the integrated circuit is protected from any damage due to excessive electrostatic discharges.

According to yet another embodiment of the present invention, a system for protecting an integrated circuit includes a first transistor coupled to a first voltage and a second voltage, a second transistor coupled to the gate of the first transistor and the first voltage, a third transistor coupled to the gate of the second transistor and the first voltage, and a first capacitor coupled to the gate of the second transistor and the second voltage. Additionally, the system includes a fourth transistor coupled to a third voltage and the second voltage, a fifth transistor including an emitter, a base, and a collector, and a first diode coupled directly or indirectly to the second voltage and the fifth transistor. Moreover, the system includes a second diode coupled to the base and the first voltage, and a clamping device coupled to the gate of the fourth transistor and the second voltage. The first voltage is provided to the integrated circuit, the third voltage is provided to the integrated circuit. The gate of the third transistor is configured to receive a first control signal, and the gate of the second transistor is configured to receive a second control signal.

According to yet another embodiment of the present invention, a method for protecting an integrated circuit includes providing a system for protecting the integrated circuit. The system includes a first transistor coupled to a first voltage, a second transistor, a third transistor, a capacitor, a fourth transistor, a fifth transistor, a first diode, and a second diode. Additionally, the method includes turning on the first transistor, receiving a first control signal by the third transistor, and turning off the third transistor in response to the first control signal. Moreover, the method includes receiving a second control signal by the second transistor a time period after the third transistor being turned off, turning off the second transistor in response to the second control signal, and turning off the first transistor in response to the second transistor being turned off. Moreover, the method includes receiving the second voltage by the fourth transistor and the fifth transistor, causing a breakdown of the first diode, turning on the fifth transistor in response to the breakdown of the first diode, and turning on the fourth transistor in response to the fifth transistor being turned on. Also, the method includes turning on the second diode if the second voltage is larger than the first voltage by a first predetermined value. The first voltage is provided to the integrated circuit, and the second voltage is provided to the integrated circuit.

According to yet another embodiment of the present invention, a system for protecting an integrated circuit includes a transistor coupled to a first voltage and a second voltage, a Zener diode including an anode and a cathode and coupled to the gate of the second transistor and the first voltage, and a resistor coupled to the gate of the second transistor and the second voltage. The first voltage is provided to the integrated circuit, the anode is connected to the gate, and the cathode is connected to the first voltage.

Many benefits are achieved by way of the present invention over conventional techniques. For example, some embodiments of the present invention provide effective triggering schemes, which can improve ESD protections. Certain embodiments of the present invention provide different triggering schemes based on pin voltage ratings and applications. Some embodiments of the present invention provide an ESD protection system that does not cause any noticeable difference during normal operation.

Various additional objects, features and advantages of the present invention can be more fully appreciated with reference to the detailed description and the accompanying drawings that follow.

DETAILED DESCRIPTION OF THE INVENTION

The present invention is directed to integrated circuits. More particularly, the invention provides a system and method for electrostatic discharge protection. Merely by way of example, the invention has been applied to signals at various voltages. But it would be recognized that the invention has a much broader range of applicability.

Figure 1:
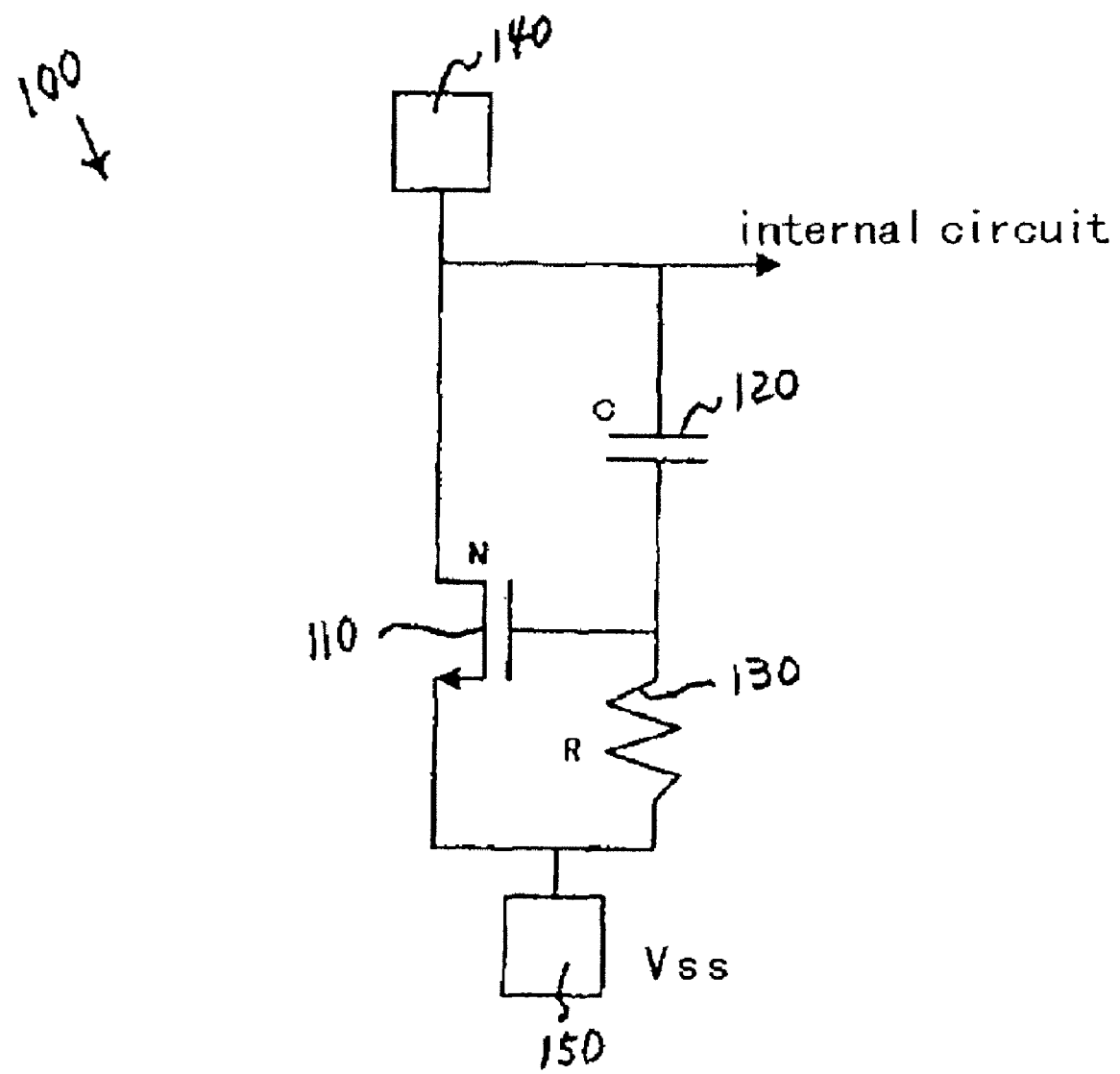
FIG. 1 is a simplified conventional system for ESD protection.

As shown in FIG. 1, the system 100 is often not suitable for high voltage applications. For example, the normal voltage at the pad 140 can be up to 40 volts or higher. Hence the rate of voltage change can be large under normal conditions, and can turn on the NMOS transistor 110 to interfere with the internal circuit.

Figure 2:
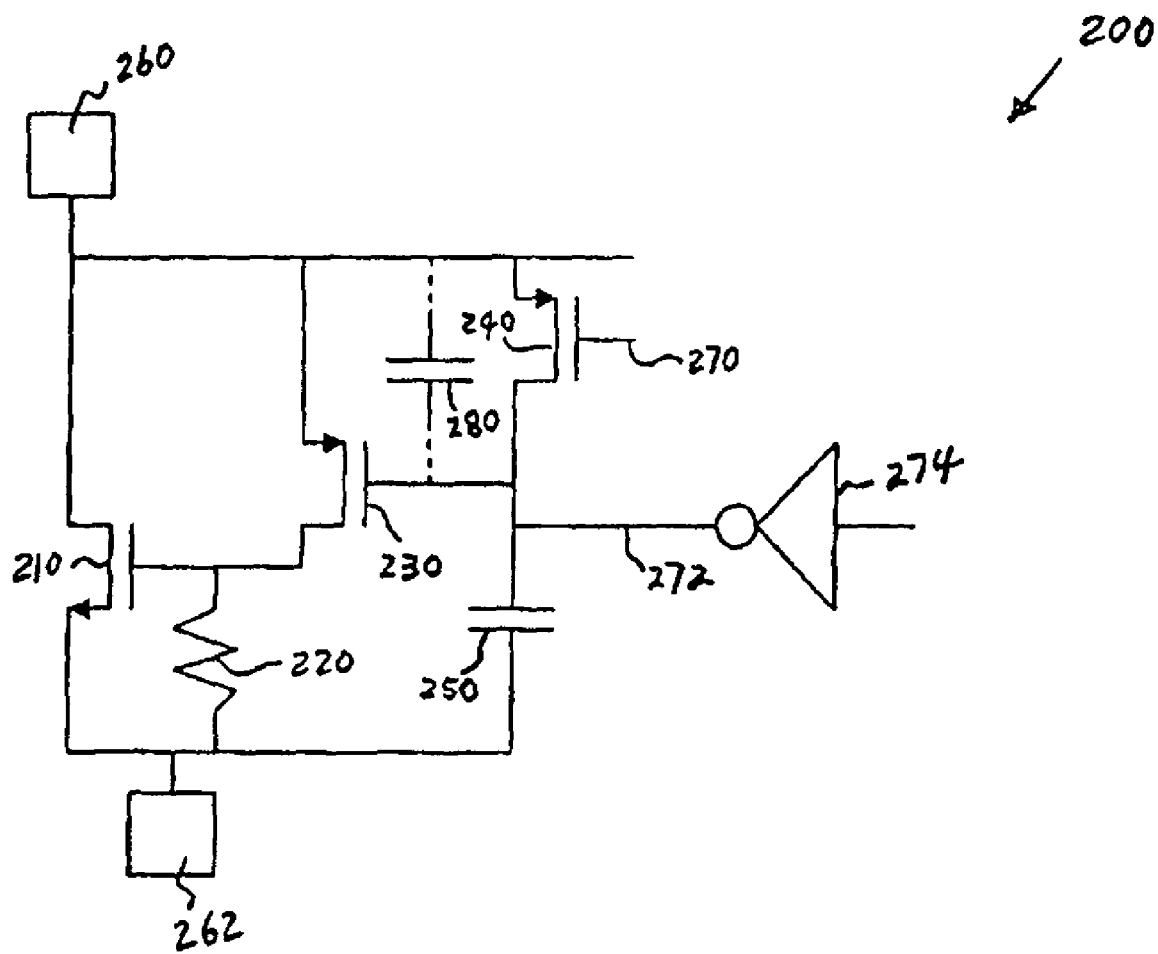
FIG. 2 is a simplified system for electrostatic discharge protection according to an embodiment of the present invention.

FIG. 2 is a simplified system for electrostatic discharge protection according to an embodiment of the present invention. This diagram is merely an example, which should not unduly limit the scope of the claims. One of ordinary skill in the art would recognize many variations, alternatives, and modifications. A system 200 includes a transistor 210, a resistor 220, transistors 230 and 240, and a capacitor 250. Although the above has been shown using a selected group of components for the system 200, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The transistor 210 is an NMOS transistor and coupled to both pads 260 and 262. For example, the NMOS transistor is a high-voltage transistor. As shown in FIG. 2, the pad 260 provides a signal to another system, which is protected by the system 200. For example, the protected system includes an integrated circuit. In another example, the pad 260 is biased to a high voltage level of $V_{dd}$, which serves as a power supply to the protected system. In one embodiment, a high voltage level of $V_{dd}$ is equal to or lower than 40 volts under normal operation of the protected system. Additionally, the pad 262 is biased to a voltage level of $V_{ss}$. For example, the voltage level of $V_{ss}$ is equal to 0 volt under normal operation of the protected system. The resistor 220 and the capacitor 250 both are connected to the pad 262.

According to one embodiment of the present invention, the transistors 230 and 240 each are a PMOS transistor, whose source is coupled to the pad 260. For example, the PMOS transistor is a high-voltage transistor. In another embodiment, the protected system provides a control signal 270 to the gate of the transistor 240, and a control signal 272 to the gate of the transistor 230. For example, the control signal 270 is at a logic high level after the protected system starts powering up, and at a logic low level before the protected system starts powering up. In another example, the control signal 270 is a power-on-reset (POR) signal. Additionally, the control signal 272 is set to a logic high level after a delay period from the time when the control signal 270 changes from the logic low level to the logic high level. For example, the delay period is about several microseconds. In another example, the delay period is shorter than 10 μs. In yet another example, the protected system includes an inverter 274, which outputs the control signal 272.

According to another embodiment, the transistor 210 serves as a protection device for conducting the ESD current. The resistor 220, the transistors 230 and 240, and the capacitor 250 can provide for a triggering mechanism. For example, during normal operation of the protected system, the control signals 270 and 272 each are at a logic high level. The control signal 270 turns off the transistor 240, and the control signal 272 turns off the transistor 230. The gate of the transistor 210 is thus grounded through the resistor 220, and the transistor 210 is turned off. The system 200 is in an off state during normal operation of the protected system.

In another example, the voltage level at the pad 260 increases to a threshold voltage at which the control signal 270 changes from a logic low level to a logic high level. Before the threshold voltage is reached, the gate of the transistor 240 is biased to the logic low level, and the transistor 240 is turned on. In response, the gate of the transistor 230 is pulled high through the transistor 240. The transistor 230 is turned off, and the gate of the transistor 210 is grounded through the resistor 220. The transistor 210 is turned off. When the voltage level at the pad 260 reaches the threshold voltage, the control signal 270 changes from a logic low level to a logic high level. The transistor 240 is turned off.

As discussed above, the control signal 272 is set to a logic high level after a delay period from the time when the control signal 270 changes from the logic low level to the logic high level. Within the delay period, the gate of the transistor 230 is DC floating. For example, the system 200 includes a parasitic capacitor 280, which includes parasitic capacitors between the gate of the transistor 230 and the pad 260. In another example, the voltage level at the pad 260 keeps rising during an ESD event. The source voltage of the transistor 230 also increases but the gate voltage of the transistor 230 increases slowly due to a small ratio of the parasitic capacitor 280 to the capacitor 250. For example, in response to excessive electrostatic discharges, the gate voltage of the transistor 230 is substantially AC grounded. Accordingly, the transistor 230 is turned on in response to excessive electrostatic discharges. When the transistor 230 is turned on, the transistor 210 is also turned on. The transistor 210 serves as a protection device for conducting the ESD current.

After the delay period, the control signal 272 is set to a logic high level. The control signal 270 turns off the transistor 240, and the control signal 272 turns off the transistor 230. The gate of the transistor 210 is thus grounded through the resistor 220, and the transistor 210 is turned off. The system 200 is in an off state during normal operation of the protected system.

As discussed above and further emphasized here, FIG. 2 is merely an example, which should not unduly limit the scope of the claims. One of ordinary skill in the art would recognize many variations, alternatives, and modifications. For example, the pad 260 is biased to a voltage other than the power supply $V_{dd}$. In another example, the delay period is adjusted to cover the duration of an ESD event. For some embodiments, the duration of an ESD event is about a couple of hundred nanoseconds, so the delay period of several microseconds is sufficient.

Figure 3:
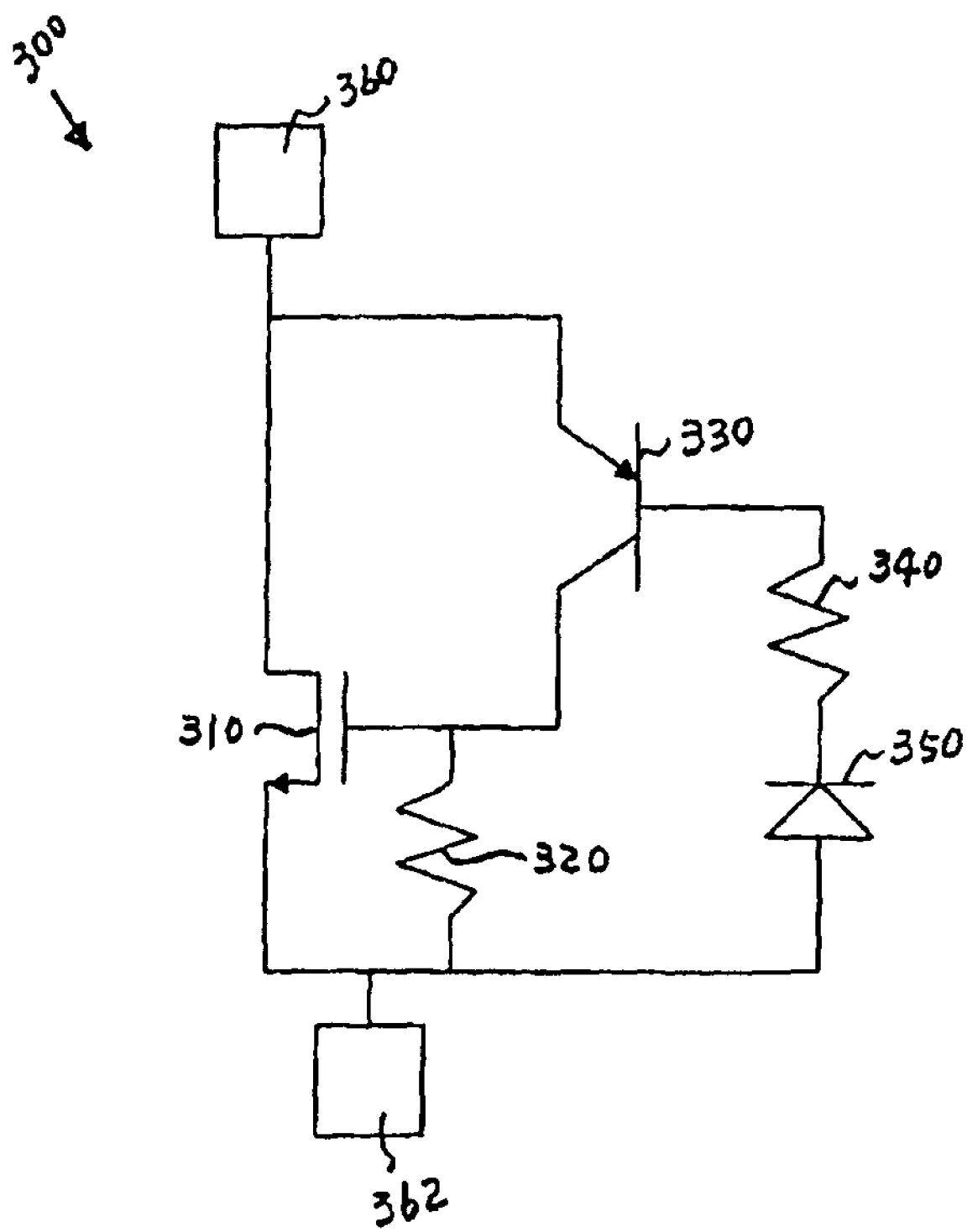
FIG. 3 and FIG. 3(A) are each a simplified system for electrostatic discharge protection according to another embodiment of the present invention.
Figure 3A:
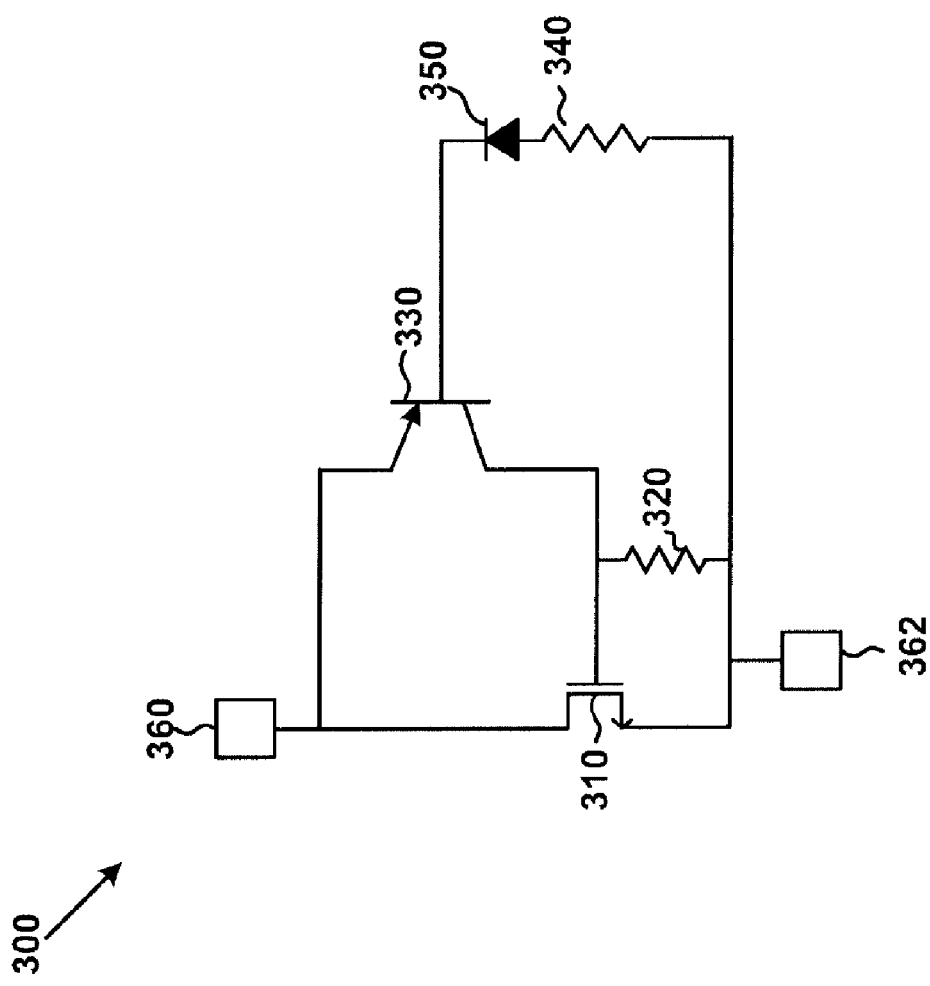

FIG. 3 is a simplified system for electrostatic discharge protection according to another embodiment of the present invention. This diagram is merely an example, which should not unduly limit the scope of the claims. One of ordinary skill in the art would recognize many variations, alternatives, and modifications. A system 300 includes a transistor 310, a resistor 320, a transistor 330, a resistor 340, and a diode 350. Although the above has been shown using a selected group of components for the system 300, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

In one embodiment, the transistor 310 is a NMOS transistor. For example, the NMOS transistor is a low voltage transistor. Additionally, the transistor 330 is a bipolar transistor. For example, the bipolar transistor is a PNP transistor. In another example, the transistor 330 includes a base region inside an N well, and an emitter region and a collector region formed by P+ diffusion regions in the N well. Moreover, the diode 350 is Zener diode. As shown in FIG. 3, the gate of the transistor 310 is connected to the resistor 320 and the collector of the transistor 330. The base of the transistor 330 is connected to the diode 350 through the resistor 340. The emitter of the transistor 330 is connected to a pad 360, which is also coupled to the drain of the transistor 310. For example, the pad 360 provides a signal to another system, which is protected by the system 300. In one embodiment, the protected system includes an integrated circuit. In another example, the voltage at the pad 360 ranges from 0 volt to 5 volts under normal operation of the protected system. Additionally, the source of the transistor 310 and the resistor 320 both are connected to a pad 362, and the pad 362 is biased to a ground voltage level of $V_{ss}$.

During normal operation, the Zener diode 350 does not breakdown. The gate of the transistor 310 is hence grounded through the resistor 320, and the transistor 310 is turned off. Therefore, the system 300 is in an off state under normal operation of the protected system. During an ESD event, the voltage level for the pad 360 increases up to or above the sum of the Zener breakdown voltage and the voltage drop between the base and the emitter of the transistor 330. In response, the Zener diode breaks down. The diode current biases the base of the transistor 330 and turns on the transistor 330. Accordingly, the collector current of the transistor 330 raises the gate voltage of the transistor 310 through the resistor 320. The transistor 310 is turned on for conducting the ESD current.

For example, the Zener diode 350 has a breakdown voltage ranging from 5.5 volts to 6 volts, and the normal voltage level for the pad 360 ranges from 0 to 5 volts. In one embodiment, the breakdown voltage of the Zener diode 350 is equal to about 5.8 volts. During an ESD event, the voltage level for the pad 360 increases up to or above the sum of 5.8 volts and 0.7 volts, which is equal to about 6.5 volts. In response, the Zener diode 350 breaks down. In another example, the resistor 340 is used to limit the current flowing through the Zener diode 350. Without the resistor 340, a high current may cause the failure of the Zener diode 350. In one embodiment, the resistor 340 is placed between the based of the transistor 330 and the cathode of the Zener diode 350 as shown in FIG. 3. In another embodiment, the resistor 340 is placed between the anode of the Zener diode 350 and the pad 362.

As discussed above and further emphasized here, FIG. 3 is merely an example, which should not unduly limit the scope of the claims. One of ordinary skill in the art would recognize many variations, alternatives, and modifications. For example, additional Zener diodes are added in series with the Zener diode 350. With additional Zener diodes, the triggering voltage for ESD protection is adjusted. In one embodiment, the Zener diode has a breakdown voltage of about 5.8 volts, and the normal voltage level for the pad 360 is higher than 5 volts. With the additional Zener diodes, the ESD protection is turned off during normal operation.

Figure 4:
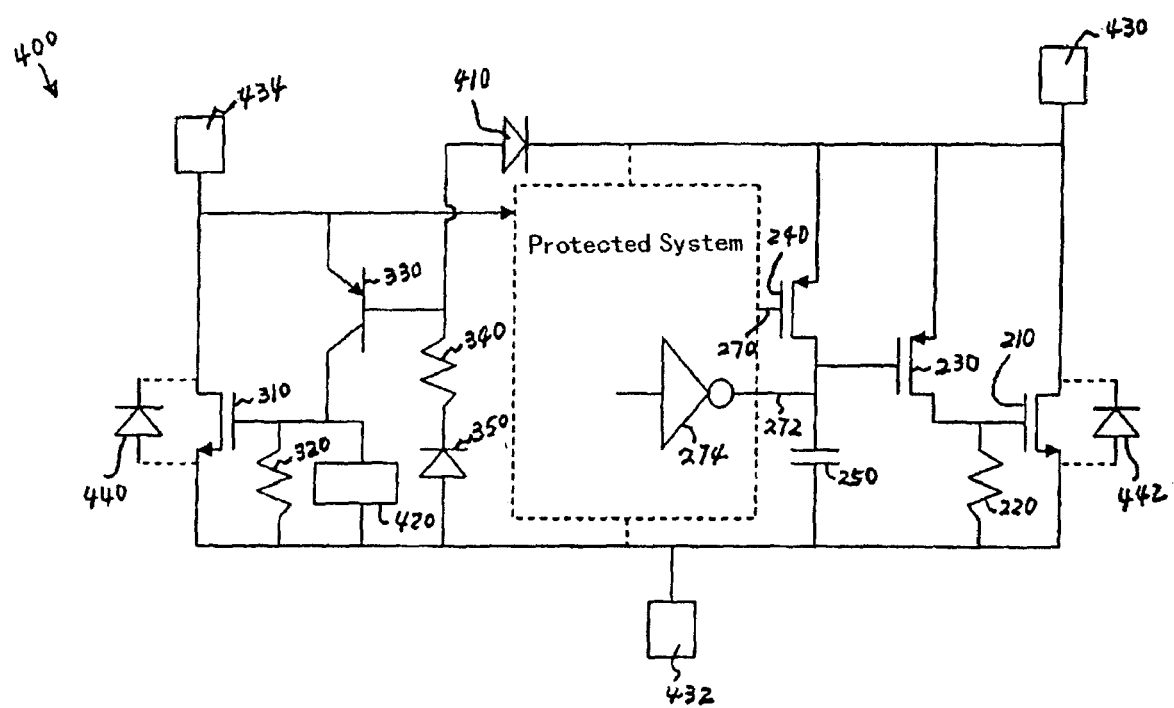
FIG. 4 is a simplified system for electrostatic discharge protection according to yet another embodiment of the present invention.

FIG. 4 is a simplified system for electrostatic discharge protection according to yet another embodiment of the present invention. This diagram is merely an example, which should not unduly limit the scope of the claims. One of ordinary skill in the art would recognize many variations, alternatives, and modifications. A system 400 includes the transistor 210, the resistor 220, the transistors 230 and 240, the capacitor 250, the transistor 310, the resistor 320, the transistor 330, the resistor 340, the diode 350, a diode 410, and a claming device 420. Although the above has been shown using a selected group of components for the system 400, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

As shown in FIG. 4, the transistor 210 is coupled to both pads 430 and 432. The pad 430 provides a signal to another system, which is protected by the system 400. For example, the protected system includes an integrated circuit. In another example, the pad 430 is biased to a high voltage level of $V_{dd}$, which serves as a power supply to the protected system. In another example, the pad 432 is biased to a voltage level of $V_{ss}$. Additionally, the resistor 220 and the capacitor 250 both are connected to the pad 432, and the transistors 230 and 240 are coupled to the pad 430. Moreover, the protected system provides a control signal 270 to the gate of the transistor 240, and a control signal 272 to the gate of the transistor 230. For example, the protected system includes the inverter 274, which outputs the control signal 272.

The gate of the transistor 310 is connected to the resistor 320 and the collector of the transistor 330. The base of the transistor 330 is connected to the diode 350 through the resistor 340. The emitter of the transistor 330 is connected to a pad 434, which is also coupled to the drain of the transistor 310. Additionally, the source of the transistor 310 and the resistor 320 both are connected to the pad 432. Moreover, the diode 410 is coupled between the base of the diode 330 and the pad 430. For example, the diode 410 is a high voltage diode. In another example, the diode 410 includes an N well and a P well. The clamping device 420 is coupled between the gate of the transistor 310 and the pad 432. For example, the clamping device 420 includes PN junction diodes, NMOS diodes, and/or Zener diodes in series.

The pads 430 and 434 each provide a signal to the system protected by the system 400. For example, the pad 430 is biased to a high voltage level of $V_{dd}$, which serves as a power supply to the protected system. In another example, the pad 434 is biased to a voltage ranging from 0 volt to 5 volts under normal operation of the protected system. In yet another example, the pad 432 is biased to a voltage level of $V_{ss}$. In one embodiment, the voltage level of $V_{ss}$ is equal to 0 volt under normal operation of the protected system.

As shown in FIG. 4, the diode 410 is used to ensure that the voltage at the pad 434 does not exceed the voltage at the pad 430 by a predetermined amount. For example, if a positive ESD strike occurs between the pads 434 and 430, the ESD current can be conducted through the emitter-base junction of the transistor 330 and the diode 410. Additionally, there are two parasitic diodes 440 and 442, which are body diodes for the transistors 310 and 210 respectively. The diode 440 is used to ensure that the voltage at the pad 432 does not exceed the voltage at the pad 434 by a predetermined amount, and the diode 442 is used to ensure that the voltage at the pad 432 does not exceed the voltage at the pad 430 by a predetermined amount. For example, the parasitic diode 440 or 442 can conduct the ESD current if a negative ESD strike occurs between the pad 434 or 430 and the pad 432 respectively.

Additionally, the clamping device 420 is used to limit the gate voltage of the transistor 310 to a predetermined value. For example, the predetermined value is higher than the threshold voltage of the NMOS transistor 310. In another example, the clamping device 420 can protect the transistor 310 from being damaged during an ESD event.

As discussed above and further emphasized here, FIG. 4 is merely an example, which should not unduly limit the scope of the claims. One of ordinary skill in the art would recognize many variations, alternatives, and modifications. For example, the pads 430 and 434 each provide a signal to the protected system. In one embodiment, the pad 430 is biased to a voltage other than the high voltage level of $V_{dd}$, and/or the pad 432 is biased to a voltage other than one between 0 volt and 5 volts. In yet another embodiment, the pad 432 is biased to a voltage other than the ground voltage level of $V_{ss}$.

According to another embodiment of the present invention, the capacitor 120 is replaced by a Zener diode in FIG. 1. The anode of the Zener diode is coupled to the gate of the transistor 110, and the cathode of the Zener diode is coupled to the pad 140. In yet another embodiment, additional Zener diodes are added in series with the Zener diode. Using additional Zener diodes, the triggering voltage for ESD protection is adjusted. In yet another embodiment, the protected system includes an integrated circuit.

The present invention has various advantages. Some embodiments of the present invention provide effective triggering schemes, which can improve ESD protections. Certain embodiments of the present invention provide different triggering schemes based on pin voltage ratings and applications. Some embodiments of the present invention provide an ESD protection system that does not cause any noticeable difference during normal operation.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for protecting an integrated circuit, the system comprising:
   a first transistor coupled to a first voltage and a second voltage, the first transistor including a first gate;
   a second transistor coupled to the first gate and the first voltage, the second transistor including a second gate;

a third transistor coupled to the second gate and the first voltage, the third transistor including a third gate; and a capacitor coupled to the second gate without through any direct contact with any other component of the second transistor, the capacitor being further coupled to the second voltage;

wherein:

the third gate is configured to receive a first signal;

the second gate is configured to receive a second signal; and the second signal is capable of turning off the second transistor a time period after the third transistor is turned off.

2. The system of claim 1 wherein the first transistor is configured to be in an on state within the time period if the second transistor is turned on.

3. The system of claim 2 wherein the second transistor is configured to be turned on in response to excessive electrostatic discharges.

4. The system of claim 2 wherein the first transistor is configured to be turned off in response to the second transistor being turned off.

5. The system of claim 1 wherein the second gate is configured to be substantially AC grounded during the time period in response to excessive electrostatic discharges.

6. The system of claim 1 wherein the first signal is configured to change from a logic low level to a logic high level after the integrated circuit starts powering up.

7. The system of claim 6 wherein the second signal is configured to be at the logic high level the time period after the integrated circuit starts powering up.

8. The system of claim 1, and further comprising a resistor coupled to the first gate and the second voltage.

9. A system for protecting an integrated circuit, the system comprising:

a first transistor including a first gate;

a second transistor coupled to the first gate and a first voltage, the second transistor including a second gate;

a third transistor coupled to the second gate and the first voltage, the third transistor including a third gate;

a first capacitor coupled to the second gate without through any direct contact with any other component of the second transistor, the first capacitor being further coupled to a second voltage;

a fourth transistor coupled to a third voltage and the second voltage, the fourth transistor including a fourth gate;

a fifth transistor including an emitter, a base, and a collector, the fifth transistor coupled to the third voltage;

a first diode coupled directly or indirectly to the second voltage and the fifth transistor;

a second diode coupled to the base and the first voltage; and a clamping device coupled to the fourth gate and the second voltage;

wherein:

the third gate is configured to receive a first signal; and the second gate is configured to receive a second signal.

10. The system of claim 9 wherein:

the second diode includes an anode and a cathode;

the anode is connected to the base; and the cathode is connected to the first voltage.

11. The system of claim 9 wherein the clamping device is configured to limit a voltage level associated with the fourth gate.

12. The system of claim 9, and further comprising:

a resistor;

wherein the first diode is coupled indirectly through the resistor to the second voltage or the fifth transistor.

13. The system of claim 9 wherein the second signal is capable of turning off the second transistor a time period after the third transistor is turned off.

14. A system for protecting an integrated circuit, the system comprising:

a first transistor coupled directly to a first voltage and a second voltage, the first transistor including a gate;

a second transistor including an emitter, a base, and a collector;

a first resistor including a first terminal and a second terminal, the first terminal being coupled directly to the base, the first terminal being different from the second terminal;

a second resistor including a third terminal and a fourth terminal, the third terminal being coupled directly to the gate, the third terminal being coupled directly to the collector, the fourth terminal being coupled directly to the second voltage; and a first diode including an anode and a cathode, the anode being coupled directly to the second voltage, the cathode being coupled directly to the second terminal.

15. The system of claim 14 wherein:

the first transistor is an NMOS transistor; and the second transistor is a PNP bipolar transistor.

16. The system of claim 14 wherein the first diode includes a Zener diode.

17. The system of claim 16, and further comprising at least another Zener diode in series with the Zener diode.

18. A system for protecting an integrated circuit, the system comprising:

a first transistor coupled directly to a first voltage and a second voltage, the first transistor including a gate;

a second transistor including an emitter, a base, and a collector;

a first resistor including a first terminal and a second terminal, the second terminal being coupled directly to the second voltage, the second terminal being different from the first terminal;

a second resistor including a third terminal and a fourth terminal, the third terminal being coupled directly to the gate, the third terminal being coupled directly to the collector, the fourth terminal being coupled directly to the second voltage; and a first diode including an anode and a cathode, the cathode being coupled directly to the base, the anode being coupled directly to the first terminal.

* * * * *